(12) United States Patent
Nikitin et al.

(10) Patent No.: US 7,219,321 B2
(45) Date of Patent: May 15, 2007

(54) PROCESS AND APPARATUS FOR MEMORY MAPPING

(75) Inventors: Andrey A. Nikitin, Moscow (RU);
 Alexander E. Andreev, San Jose, CA (US); Anatoli A. Bolotov, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 422 days.

(21) Appl. No.: 10/830,739

(22) Filed: Apr. 25, 2004

(65) Prior Publication Data

US 2005/0240746 A1 Oct. 27, 2005

(51) Int. Cl.
 G06F 9/45 (2006.01)
 G06F 17/50 (2006.01)
 H03K 17/693 (2006.01)
 H03K 19/00 (2006.01)
(52) U.S. Cl. .............................. 716/8; 716/16; 716/17
(58) Field of Classification Search .................... 716/8, 716/16–17
 See application file for complete search history.

(56) References Cited

U.S. PATENT DOCUMENTS

| | | | |
|---|---|---|---|
| 4,400,794 A | 8/1983 | Koos | |
| 6,601,205 B1 | 7/2003 | Lehmann et al. | |
| 6,611,952 B1 | 8/2003 | Prakash et al. | |
| 6,871,328 B1 * | 3/2005 | Polk | 716/1 |
| 2004/0193829 A1 | 9/2004 | Woo et al. | |
| 2005/0240746 A1 | 10/2005 | Nikitin et al. | |

OTHER PUBLICATIONS

U.S. Appl. No. 10/688,460, filed Oct. 17, 2003, Process and Apparatus for Fast Assignment of Objects to a Rectangle (22 pages).
U.S. Appl. No. 10/694,208, filed Oct. 27, 2003, Process and Apparatus for Placement of Cells in an IC During Floorplan Creation (26 pages).

* cited by examiner

Primary Examiner—Paul Dinh
Assistant Examiner—Suresh Memula
(74) Attorney, Agent, or Firm—Westman, Champlin & Kelly

(57) ABSTRACT

A plurality of user-defined memories are mapped to pre-defined basic memories, such as defined on a base platform. The user-defined memories are dividing into classes of similar memories. A mapping technique is selected for members of a selected class of user-defined memories that minimizes the ratio $(\max_{i,j}(USED_{i,j}/AVAIL_{i,j}))$ of basic memories that have been mapped to basic memories that are available for mapping. If the number of different memory mappings is smaller than a threshold the mapping technique is applied to each user-defined memory. If the number of different memory mappings is greater than the threshold, the groups are arranged in ordered queues of single memory types based on a mapping price and the mapping technique is selected based on a memory of each group and is applied to each user-defined memory in the respective group.

20 Claims, 1 Drawing Sheet

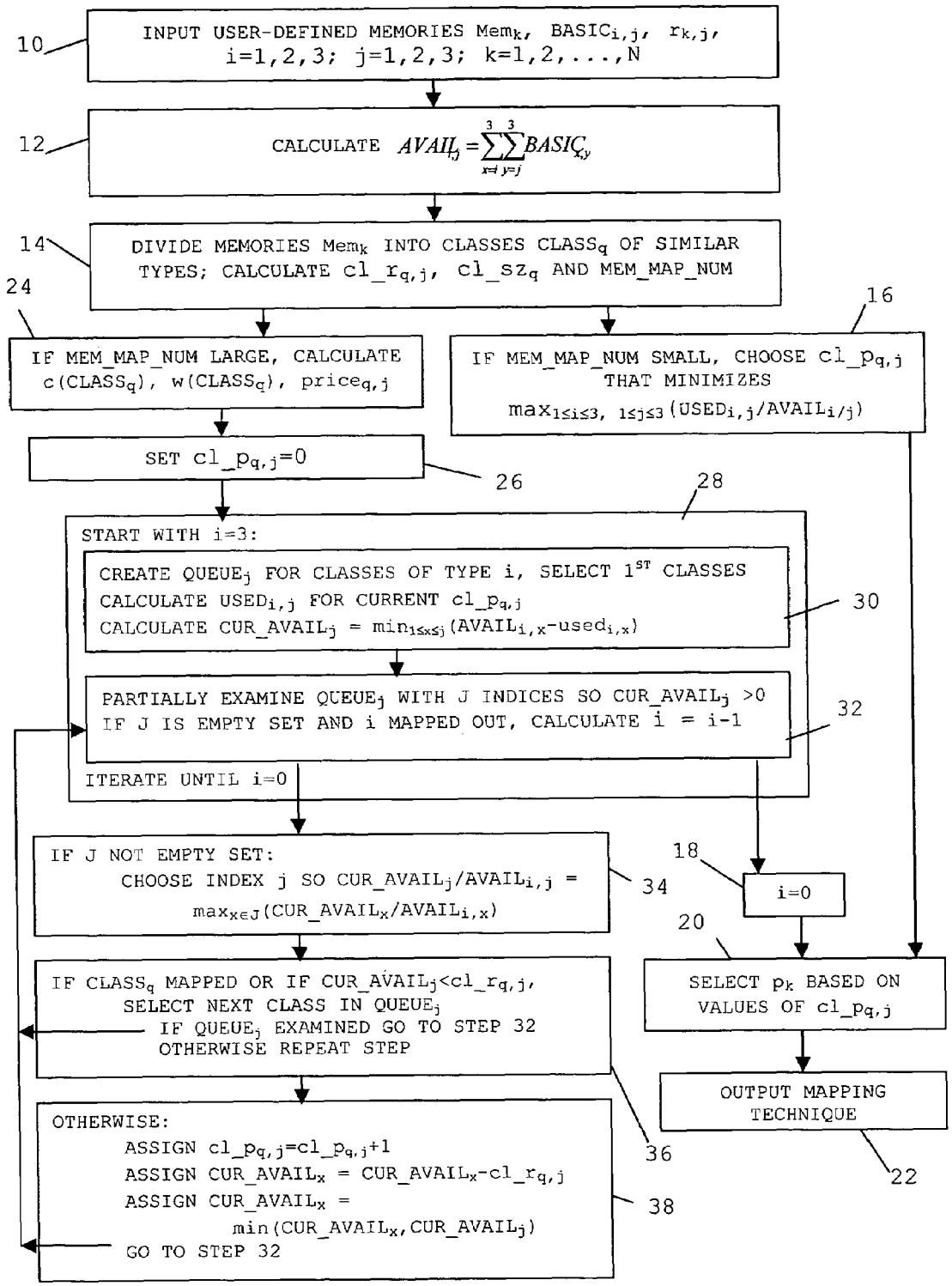

PROCESS AND APPARATUS FOR MEMORY MAPPING

FIELD OF THE INVENTION

This invention relates to creation of IC floorplans, and particularly to mapping user-defined memories into standard or basic memories for implementation in basic IC platforms.

BACKGROUND OF THE INVENTION

Integrated circuits are used in a wide range electronic devices produced by a large number of device manufacturers. In practice, ICs are seldom manufactured (fabricated) by the electronic device manufacturer. Instead ICs are manufactured by an IC foundry to the specifications of the electronic device manufacturer. The design of the IC is usually the result of corroboration between the device manufacturer and the IC foundry.

The design and manufacture of an application-specific IC, or ASIC, is usually a long and tedious process, requiring development of a hardware description language (HDL) description of the circuit, usually in a synthesizable register transfer language (synthesizable RTL), synthesizing the RTL description to a technology library of components, and ultimately fabricating the circuit into an IC chip. During the process, testing and re-designing is necessary to optimize cell placement to meet physical constrains, wire routing and timing constraints. The process is time consuming and costly.

To reduce the time and cost of development of ASICs, IC foundries have developed standard, or base, platforms containing silicon layers of an IC, but without metal interconnection layers. The silicon layers are configured into gates that can be configured into cells using tools supplied by the IC foundry. The chip designer designs additional metal layers for the base platform to thereby configure the chip into a custom ASIC employing the customer's intellectual property. The IC foundry ordinarily supplies tools to the IC designer to enable the designer to quickly and accurately configure the base platform to a custom ASIC compatible with the foundry's fabrication technology. An example of such a configurable base platform is the RapidChip® platform available from LSI Logic Corporation of Milpitas, California. The RapidChip platform permits the development of complex, high-density ASICs in minimal time with significantly reduced design and manufacturing risks and costs.

The design effort can be considered as encompassing several stages. After the chip size and the placement of the I/O cells has been selected, the megacells, including memories, are placed. Thereafter, standard cells are place to complete the chip. The present invention deals with placement of memories, and particularly to mapping user's custom memories to standard or basic memories that are incorporated into the base platform.

Consider a base platform containing a predetermined number of basic memories of predetermined types. The design created by the IC designer may contain user-defined memories that are different from the basic memories. The present invention is directed to techniques for mapping user-defined memories to basic memories so that the user-defined memories can be implemented in basic memories on the base platform.

SUMMARY OF THE INVENTION

In one embodiment of the present invention, a plurality of user-defined memories are mapped to pre-defined basic memories by dividing the user-defined memories into classes of similar user-defined memories, which in some embodiments are memories with the same type and capacity. A maximal ratio ($\max_{i,j}(USED_{i,j}/AVAIL_{i,j})$) is calculated of basic memories that have been mapped ($USED_{i,j}$) to basic memories that are available for mapping ($AVAIL_{i,j}$). Mapping techniques are selected for members of each class of user-defined memories that minimizes the ratio. The calculated maximal ratio and selection of the mapping technique are iteratively repeated for each class.

In some embodiments an estimate is calculated of the number of different memory mappings necessary to map the user-defined memories to the basic memories. If the number of different memory mappings exceeds a threshold, a mapping price is calculated for each class. Queues of similar memories are created for each memory type, with the memories arranged in order of mapping prices. A mapping technique is selected for one memory of a class, and is applied to all of the memories of the class. The process is repeated for each class of each queue.

If the number of different memory mappings does not exceed the threshold, all user-defined memories are mapped to basic memories.

In other embodiments, a computer useable medium contains a computer readable program comprising computer readable program code for addressing data to cause a computer to carry out the process of the invention.

BRIEF DESCRIPTION OF THE DRAWINGS

The sole FIGURE is a flowchart of the process of carrying out the process of mapping memories according to an embodiment of the present invention

DETAILED DESCRIPTION OF THE PREFERRED EMBODIMENTS

Memory mapping can be considered in two parts: (1) whether it is even possible to map a given set of user-defined memories into a predetermined set of basic memories, and (2) if it is possible, to find the optimal solution of such a mapping.

For purposes of the present invention, each memory M may be defined by three parameters:

1) capacity c(M) is the number of words that can be stored in memory M,
2) width w(M) is the bit size of words stored in memory M, and
3) type t(M).

The type t(M) has a value of 1, 2 or 3, where
  t(M)=1 is assigned to memories that execute only one read or one write operation during each clock cycle, 1RW,
  t(M)=2 is assigned to memories that execute one read and one write operation during each clock cycle, 1R1W, or
  t(M)=3 is assigned to memories that execute not more than two read or write operations during each clock cycle, 2RW.

Consider a user-defined memory M. Memory M can be mapped into the set of basic memories $M_1, M_2, \ldots, M_K$ if memory M can be presented as the netlist that consists of memories $M_1, M_2, \ldots, M_K$ and some logic cells. Thus, memory M, having a capacity (k*C), can be mapped into the set of memories $M_1, M_2, \ldots, M_K$ having the capacity C and the same width and type. If two user-defined memories M1 and M2 are such that $t(M1) \leq t(M2)$, $w(M1) \leq w(M2)$, $c(M1) \leq c(M2)$, then memory M1 can be mapped into a similar set of basic memories as memory M2.

Consider a chip platform containing a predetermined number of basic memories. All of the basic memories have the same width W, and each basic memory has a capacity corresponding to one of the capacities of the set $\{C_1, C_2, C_3, \ldots\}$ where $C_1 < C_2 < C_3 < \ldots$ . For ease of explanation, it will be assumed that the set of capacities is composed of three capacities $C_j$, where j=1,2,3, but the number of capacities (j) may be any convenient number. $BASIC_{i,j}$ (i=1,2,3; j=1,2,3) is the number of the basic memories of type i and capacity $C_j$ in the chip platform.

The user-defined memories are designated $Mem_1, Mem_2, \ldots, Mem_N$, where N is the number of user-defined memories. The goal is to map the user-defined memories into the given set of basic memories, namely to map the user-defined memories $Mem_1, Mem_2, \ldots, Mem_N$ into basic memories $M_1, M_2, \ldots, M_K$.

For each j=1,2,3 and each k=1,2, . . . ,N, the number $r_{k,j}$ is the minimal possible number of basic memories with type $t(Mem_k)$, width W and capacity $C_j$ into which the user memory $Mem_k$ can be mapped. For each k=1,2, . . . ,N, $r_{k,1} \leq r_{k,2} \geq r_{k,3}$. This means that the number of basic memories required to map user-defined memory $Mem_k$ increases as each basic memory capacity decreases. Where $j \in \{1,2,3\}$, there are three ways that each user-defined memory $Mem_k$ (k=1,2, . . . ,N) can be mapped to the basic memory:

1) map memory $Mem_k$ into $r_{k,1}$ memories of capacity $C_1$;
2) map memory $Mem_k$ into $r_{k,2}$ memories of capacity $C_2$;
3) map memory $Mem_k$ into $r_{k,3}$ memories of capacity $C_3$.

The value $p_k$ (k=1,2, . . . ,N) is a number assigned to one of the ways of mapping the user memory $Mem_k$ to a basic memory. Hence, the number $p_k$ designates a mapping technique. Where $j \in \{1,2,3\}$, $p_k \in \{1,2,3\}$.

In order to take into account the fact that the basic memory with type $i_1$ and capacity $C_{j1}$ can be mapped into the basic memory with type $i_2$ and capacity $C_{j2}$, for each $i_1 \leq i_2$ and $j_1 \leq j_2$ consider the numbers $AVAIL_{i,j}$ (i=1,2,3; j=1,2,3) instead of the numbers $BASIC_{i,j}$, where $$AVAIL_{i,j} = \sum_{x=i}^{3} \sum_{y=j}^{3} BASIC_{x,y}.$$

The number $AVAIL_{i,j}$ is the total number of available basic memories $M_{basic}$ with type $t(M_{basic}) \geq i$ and capacity $c(M_{basic}) \geq C_j$.

For each i=1,2,3, j=1,2,3, the number $USED_{i,j}$ denotes the number of basic memories, $M_{basic}$, of type $t(M_{basic}) \geq i$ and capacity $c(M_{basic}) \geq C_j$ into which the user-defined memories are already mapped by the mapping technique $p_k$ (k=1,2, . . . ,N).

$$USED_{i,j} = \sum_{\substack{k=1,2,\ldots N \\ t(Mem_k) \geq i \\ p_k \geq j}} r_{k,p_k}$$

Using these definitions, the problem of memory mapping is defined as finding the mapping technique $p_k$ (k=1,2, . . . , N) for the given user memories $Mem_k$ (k=1,2, . . . ,N) and the given values $BASIC_{i,j}$ (i=1,2,3, j=1,2,3, . . . ) and $r_{k,j}$(k=1,2, . . . ,N, j=1,2,3, . . . ) such that for each i=1,2,3 and each j=1,2,3, $USED_{i,j}$ is not greater than $AVAIL_{i,j}$, i.e., $USED_{i,j} \leq AVAIL_{i,j}$. Where $j \in \{1,2,3\}$, these nine inequalities mean that the set of basic memories is enough for the mapping user memories $Mem_k$ (k=1,2, . . . ,N).

To obtain the best BISR (build-in self-repair) of memories, it is desirable to create optimal memory mapping. To accomplish this, it is important to use basic memories of different types as uniformly as practical. Therefore, a second part of the memory mapping problem is to find the mapping technique $p_k$ (k=1,2, . . . ,N) that minimizes the magnitude $\max_{i,j}(USED_{i,j}/AVAIL_{i,j})$.

The problem can be reduced to an integer programming of an NP-hard problem. However, a solution to an NP-hard problem requires an exponentially increasing computation time as the number of inputs linearly increases. In the present case, a given design may contain hundreds or even thousands of user-defined memories (N is in the hundreds or thousands). Therefore, to minimize processing time and find a good solution to memory mapping, the present invention solves the memory mapping for classes of similar user-defined memories. Using this technique, the time to execute the process is $O(N*\log N)$, resulting in a solution that is close to optimal.

For purposes of the present invention two user-defined memories $Mem_a$ and $Mem_b$ are similar if $r_{a,j} = r_{b,j}$ for each j=1,2,3 and these memories are the same type ($t(Mem_a) = t(Mem_b)$). Although two similar memories may have different width W and/or capacity C, such memories are not different for purposes of memory mapping according to the present invention.

In accordance with the present invention, the user-defined memories are divided into the classes, with each class containing similar memories. L is the number of classes and $CLASS_1, CLASS_2, \ldots, CLASS_L$ are the classes of similar user-defined memories. In most cases the user design will contain no more than about 10 memory classes, a number that is significantly less than the number N of user-defined memories.

For each class $CLASS_q$ (q=1,2, . . . ,L), $t(CLASS_q)$ is the class type (namely, the type of user-defined memories included in this class), and $cl\_r_{q,j}$ is the minimum number of basic memories of capacity $C_j$ that is required for mapping any memory $Mem_k$ from class $CLASS_q$. Since $Mem_k \in CLASS_q$, $r_{k,j} = cl\_r_{q,j}$. For each q=1,2, . . . ,L, $cl\_p_{q,j}$ is the number of user-defined memories in class $CLASS_q$ that have been mapped to the basic memories with capacity $C_j$ (j=1,2,3). Thus, $$USED_{i,j} = \sum_{\substack{q=1,2,\ldots,L \\ t(CLASS_q) \geq i}} \sum_{y=j}^{3} (cl\_p_{q,y} * cl\_r_{q,y}).$$

The number of different choices of values for $cl\_p_{q,j}$ for $CLASS_q$ is $$MEM\_MAP\_NUM_q = (cl\_sz_q + 2)*(cl\_sz_q + 1)/2,$$

where $cl\_sz_q$ is the total number of user-defined memories of class $CLASS_q$ being mapped. Consequently, the total number MEM_MAP_NUM of different memory mappings can be obtained as follows:

$$\text{MEM\_MAP\_NUM} = \prod_{q=1}^{L}((cl\_sz_q + 2)*(cl\_sz_q + 1)/2).$$

The number MEM_MAP_NUM provides an estimate of the time required to search for the optimal mapping by examining all possible memory mappings. Since the number L of user-defined memory classes is not large compared to the number N of user-defined memories, the number MEM_MAP_NUM is not large. Consequently, the mapping technique can efficiently examine all the memory mappings. In practice, we have found that the mapping algorithm may be effectively applied to all mappings if MEM_MAP_NUM$\leq 10^6$ or $10^8$, the bound depending on the power of computer system processing the memory mapping.

The sole FIGURE is a flowchart of an embodiment of the process of the present invention. It is preferred that the process be carried out in a computer or data processor under the control of a computer readable program containing program code recorded on a memory medium, such as a recording disk of a disk drive.

The process starts with the empty memory mapping $cl\_p_{q,j}=0$ ($q=1,2,\ldots,L$, $j=1,2,3$), meaning that no user memory has yet been mapped into the basic memories. The value of $cl\_sz_q$ defines the total number of user-defined memories to be mapped. During the execution of the process the values $cl\_p_{q,j}$ increase, whereas the value of $cl\_sz_q$ does not change. A class $CLASS_q$ is completely mapped if all the user memories of this class are mapped into the basic memories, that is $\Sigma_{j=1,2,3}(cl\_P_{q,j})=cl\_sz_q$.

At step 10, the definitions of the user-defined memories $Mem_1, Mem_2, \ldots, Mem_N$ are input to the process, as are value of $BASIC_{i,j}$, which is the number of basic memories of type i and capacity $C_j$ in the chip platform, and value of $r_{k,j}$, which is the minimum possible number of basic memories with type $t(Mem_k)$, width W and capacity $C_j$ such that the user-defined memories $Mem_k$ can mapped to the basic memories, where i=1,2,3 ..., j is a number (j=1,2,3 ... ) identifying a standard capacity $C_j$ and k=1,2, ..., N.

At step 12, the total number of available basic memories $AVAIL_{i,j}$ is calculated for each i and j as $$AVAIL_{i,j} = \sum_{x=i}^{3}\sum_{y=j}^{3} BASIC_{x,y}.$$

At step 14, the user-defined memories $Mem_k$ are divided into classes $CLASS_q$ of similar memory types $t(CLASS_q)$. As described above, user-defined memories $M_a$ and $M_b$ are similar if they are of the same type ($t(Mem_a)=t(Mem_b)$) and $r_{a,j}=r_{b,j}$. The number, $cl\_r_{q,j}$, of user-defined memories in each class $CLASS_q$ is identified, and the number, $cl\_sz_q$, of user memories in the class $CLASS_q$ is identified. The total number, MEM_MAP_NUM, of different memory mappings is calculated as $$\text{MEM\_MAP\_NUM} = \prod_{q=1}^{L}((cl\_sz_q + 2)*(cl\_sz_q + 1)/2).$$

If at step 14 the value of MEM_MAP_NUM is smaller than some predetermined threshold (e.g., $10^6$ or $10^8$, depending on computer processing power, then at step 16 the number of user-defined memories, $cl\_p_{q,j}$, is selected that minimizes the value of $\max_{i,j}(USED_{i,j}/AVAIL_{i,j})$. At step 20 the best memory mapping technique $p_k$ is selected for each user-defined memory, based on the current value of $cl\_p_{q,j}$. The mapping technique $p_k$ is output at step 22.

If at step 16, the best mapping technique is not found, the process is aborted because there is not enough basic memory for mapping the user-defined memories.

If at step 14, the value of MEM_MAP_NUM is greater than the predetermined threshold, then at step 24, values of the capacity of $CLASS_q$, designated $c(CLASS_q)$, the width of $CLASS_q$, designated $w(CLASS_q)$ and a penalty, designated $price_{q,j}$, are calculated. More particularly, for each $q=1,2,\ldots,L$, the capacity, $c(CLASS_q)$, and width, $w(CLASS_q)$, of this class is equal to the capacity $c(Mem_k)$ and the width $w(Mem_k)$ of some user-defined memory $Mem_k$ of this class. (There is a small degree of inaccuracy because different memories $Mem_k$ of class $CLASS_q$ may have different capacities and widths, but this inaccuracy is not material to the result.)

For each $q=1,2,\ldots,L$ and each $j=1,2,3$, the price is calculated as $$price_{q,j}=1.0-c(CLASS_q)*w(CLASS_q)/W/C_j/cl\_r_{q,j}.$$

$Price_{q,j}$ may be considered as the price that is paid for mapping the user-defined memory of class $CLASS_q$ into basic memories with capacity $C_j$.

Consider the example set forth in Table I that lists of user memories of the user design, N=168, W=20, $C_1$=512, $C_2$=1024, $C_3$=2048.

TABLE I

| user memories $Mem_k$, k | type $t(Mem_k)$ | Width $w(Mem_k)$ | Capacity $c(Mem_k)$ | $r_{k,1}$ | $r_{k,2}$ | $r_{k,3}$ |
|---|---|---|---|---|---|---|
| 1–20 | 1 (1RW) | 10 | 78 | 1 | 1 | 1 |
| 21–40 | 1 (1RW) | 20 | 76 | 1 | 1 | 1 |
| 41–42 | 3 (2RW) | 10 | 2919 | 5 | 3 | 2 |
| 43–62 | 1 (1RW) | 10 | 58 | 1 | 1 | 1 |
| 63–66 | 2 (1R1W) | 10 | 1946 | 3 | 2 | 1 |
| 67–168 | 1 (1RW) | 10 | 973 | 1 | 1 | 1 |

The user-defined memories in lines 1, 2, 4 and 6 of Table I are similar and can be included in a single class. Table II presents the list of user memory classes.

TABLE II

| Class $CLASS_q$, q | user memories $Mem_k$, k | Type t $(CLASS_q)$ | $cl\_sz_q$ | $cl\_r_{q,1}$ | $cl\_r_{q,2}$ | $cl\_r_{q,3}$ |
|---|---|---|---|---|---|---|
| 1 | 1–40, 43–62, 67–168 | 1 (1RW) | 162 | 1 | 1 | 1 |
| 2 | 63–66 | 2 (1R1W) | 4 | 3 | 2 | 1 |
| 3 | 41–42 | 3 (2RW) | 2 | 5 | 3 | 2 |

From the above example, $c(CLASS_1)$ and $w(CLASS_1)$ can be defined from Table I with four different sets of values (see lines 1, 2, 4 and 6): 78 and 10, 76 and 20, 58 and 10, 973 and 10. Choosing the fourth line, $c(CLASS_1)$=973 and $w(CLASS_1)$=10. Calculating the price for q=3 and j=1, from Table I it can be seen that $c(CLASS_3)$ is 2919, $w(CLASS_3)$ is 10 and $cl\_r_{3,1}$ is 5 and from the parameters of the user memory, W is 20 and $C_1$ is 512. Therefore, $price_{3,1}$=1.0−c $(CLASS_3)*w(CLASS_3)/W/C_1/cl\_r_{3,1}=1.0-2919*10/20/512/5=0.43$. Thus, in the example, values of price are:

$price_{3,1}=1.0-2919*10/20/512/5=0.43$.
$price_{3,2}=1.0-2919*10/20/1024/3=0.53$.
$price_{3,3}=1.0-2919*10/20/2048/2=0.29$.
$price_{2,1}=0.37$.
$price_{2,2}=0.53$.
$price_{2,3}=0.53$.
$price_{1,1}=0.05$.
$price_{1,2}=0.53$.
$price_{1,3}=0.76$.

MEM_MAP_NUM can be calculated from Table II as $$MEM\_MAP\_NUM = \prod_{q=1}^{L}((cl\_sz_q+2)*(cl\_sz_q+1)/2)$$
$$= ((162+2)*(162+1)/2)*((4+2)*(4+1)/2)*((2+2)*(2+1)/2)$$
$$= 1202940.$$

If the predetermined threshold is $10^8$, $1202940<10^8$ so at step 16 the algorithm may be applied to examine all possible memory mappings.

If MEM_MAP_NUM is greater than the threshold, then the classes $CLASS_q$ are organized into queues of same-type memories and one memory from each class is mapped. The mapping technique applied to the one memory is repeated for each other memory of the class. As noted above, at step 24 $c(CLASS_q)$, $w(CLASS_q)$ and $price_{q,j}$ are calculated. At step 26, the value of $cl\_P_{q,j}$ is set to zero (q=1,2, . . . ,L, j=1,2,3), meaning that no user memory is mapped into the basic memories.

Step 28 is an iterative repeating of steps 30 and 32, starting with i (type number) equal its maximum preset value, such as 3 (i=3). The process decrements the value of i for each iteration until completed when i=0. At step 18, i=0 and all memory types have been examined. The process concludes at steps 20 and 22 described above.

If at step 28 $i \ne 0$, the process continues to step 30 where a plurality of queues are created, $QUEUE_j$ (j=1,2,3, . . . ) for the classes of type i only. In the case of $j \in \{1,2,3\}$, three queues of are created. The classes are sorted into ascending order of the value of $price_{q,j}$, with each class being composed of user-defined memories of similar memory types. In the above example the three queues are (with the price given in parentheses):

$QUEUE_1$: $CLASS_1(0.05)$, $CLASS_2(0.37)$, $CLASS_3(0.43)$.
$QUEUE_2$: $CLASS_2(0.53)$, $CLASS_1(0.53)$, $CLASS_3(0.53)$.
(random order because all the prices are equal).
$QUEUE_3$: $CLASS_3(0.29)$, $CLASS_2(0.53)$, $CLASS_3(0.76)$.

The first class of each queue is selected for evaluation. In the example, $CLASS_1(0.05)$ is selected from $QUEUE_1$, $CLASS_3(0.29)$ is selected from $QUEUE_3$, and $CLASS_2(0.53)$ is selected from $QUEUE_2$ (the selection of $CLASS_2(0.53)$ is only because it was randomly placed as the first class of the queue). For each selected class, the value of USED is calculated based on current values of $cl\_p_{q,j}$ (j=1,2,3, . . . ). The value of CUR_AVAIL is calculated as $\min_{1 \le x \le j}(AVAIL_{i,x}-USED_{i,x})$ (j=1,2,3).

The classes in each queue are processed in linear order of the queue according to price. The first classes in the queues are selected and processed, then the next classes. In the event that the current class is the last class in the queue, an attempt to select the next class fails and the queue is completely examined.

At step 32, a set J of indexes $1 \le j \le 3$, where $j \in \{1,2,3\} \in J$, is created such that $CUR\_AVAIL_j>0$ and the queue $QUEUE_j$ is not completely examined. If J is an empty set, and if all classes of type i are completely mapped out, i is decremented, i=i−1. If i≠0, the process of steps 30 and 32 are iteratively repeated until either i=0 or J is not an empty set. If, at step 32, J is an empty set and type i is not completely mapped out, then the process is aborted because there is not enough basic memory for mapping the user-defined memories.

At step 34, if J is not an empty set, an index j is selected from set J ($j \in J$) such that $CUR\_AVAIL_j/AVAIL_{i,j}=\max_{x \in J}(CUR\_AVAIL_j/AVAIL_{i,x})$. At step 36, if the currently selected class $CLASS_q$ in queue $QUEUE_j$ is completely mapped or if $CUR\_AVAIL_j$ is smaller than the minimum number of available basic memories ($CUR\_AVAIL_j<cl\_r_{q,j}$), then the next class in queue $QUEUE_j$ is selected. If $QUEUE_j$ has been completely examined, the process loops back to step 32 to select the next queue. If $QUEUE_j$ has not been completely examined, another $CLASS_q$ in $QUEUE_j$ is selected until a class in $QUEUE_j$ is found that has not been completely mapped.

If the currently selected class $CLASS_q$ in queue $QUEUE_j$ is not completely mapped and $CUR\_AVAIL_j \ge cl\_r_{q,j}$, then at step 38 the value of the mapping technique number, $cl\_p_{q,j}$, is incremented by 1 ($cl\_p_{q,j}=cl\_p_{q,j}+1$), and either if $1 \le x \le j$, $CUR\_AVAIL_x$ is assigned equal to $CUR\_AVAIL_x-cl\_r_{q,j}$, or if $j<x \le 3$, $CUR\_AVAIL_x$ is assigned equal to $\min(CUR\_AVAIL_x, CUR\_AVAIL_j)$.

The process then loops to step 32 to supply the current value of $cl\_p_{q,j}$ (which had been incremented at step 38) to step 20.

The present invention thus provides a technique and computer program that maps user-defined memories to basic memories, such as on a base platform, for creating an ASIC. The user-defined memories are divided into classes of memories having the same type and capacity. If, at step 16, the number of different memory mappings is smaller than a threshold, such as $10^8$, a mapping technique is selected to map each user-defined memory to one or more basic memories. If, at step 24, the number of different memory mappings is greater than the threshold, the groups are arranged in queues of single memory types and in an order based on the mapping price. A mapping technique is selected for each group of memories and is applied to the members of each group to map the user-defined memories to basic memories.

Although the present invention has been described with reference to preferred embodiments, workers skilled in the art will recognize that changes may be made in form and detail without departing from the spirit and scope of the invention.

What is claimed is:

1. A process of mapping a plurality of user-defined memories to pre-defined basic memories comprising steps of:

dividing the user-defined memories into classes of similar user-defined memories, wherein similar user-defined memories in a given class have a same minimal possible number of basic memories of a particular type, width and capacity into which each of the user-defined memories of the given class can be mapped;

iteratively
calculating a maximal ratio of basic memories that have been mapped to basic memories that are available for mapping, and
selecting a mapping technique for members of a selected class of user-defined memories that minimizes the ratio.

2. The process of claim 1, further comprising:
calculating an estimate of a number of different memory mappings necessary to map the user-defined memories to the basic memories,
if the number of different memory mappings exceeds a threshold,
calculating a mapping price for each class,
for each memory type, creating a queue of classes arranged in an order based on respective mapping prices, and
the mapping technique is selected for each class of each queue.

3. The process of claim 2, wherein if the number of different memory mappings does not exceed the threshold, the mapping technique is selected for each user-defined memory of each class.

4. The process of claim 2, wherein the mapping price is calculated based on a capacity and width of memories of the class and the capacity, width and a quantity of the basic memories.

5. The process of claim 4, wherein the mapping price is calculated as $$price_{q,j}=1.0-c(CLASS_q)*w(CLASS_q)/W/C_j/cl\_r_{q,i},$$

where $c(CLASS_q)$ is the capacity of memories of the class, $w(CLASS_q)$ is the width of memories of the class, W is the width of the basic memories, $C_j$ is the capacity of the basic memories and $cl\_r_{q,i}$ is the minimum number of basic memories to which the class of memories can be mapped.

6. The process of claim 2, wherein similar user-defined memories are of a same type and have a same capacity.

7. The process of claim 2, wherein the order of classes of each queue is an ascending order of prices and the mapping techniques are first selected for classes with a smallest price for each queue.

8. In a process of designing an application-specific integrated circuit containing a plurality of user-defined memories from a platform containing a plurality of basic memories, each basic memory and each user-defined memory having a type that is a member of a predetermined group of types, each basic memory having a capacity that is a member of a predetermined group of capacities, and each user-defined memory having capacity that may or may not be a member of the group of capacities, the process of mapping the user-defined memories to the basic memories comprising steps of:
dividing the user-defined memories into classes of similar user-defined memories;
calculating an estimate of a number of different memory mappings necessary to map the user-defined memories to the basic memories; and
if the number of different memory mappings exceeds a threshold,
calculating a mapping price for each class,
for each memory type, creating a queue of classes arranged in an order based on respective mapping prices, and
selecting a respective mapping technique for each class of the queue.

9. The process of claim 8, further comprising:
iteratively
calculating a maximal ratio of basic memories that have been mapped to basic memories that are available for mapping, and
selecting the respective mapping technique for members of a selected class of user-defined memories that minimizes the ratio.

10. The process of claim 8, wherein if the number of different memory mappings does not exceed the threshold, the mapping technique is selected for each user-defined memory of each class.

11. The process of claim 8, wherein the mapping price is calculated based on the capacity and a width of memories of the class and the capacity, a width and a quantity of the basic memories.

12. The process of claim 11, wherein the mapping price is calculated as $$price_{q,j}=1.0-c(CLASS_q)*w(CLASS_q)/W/C_j/cl\_r_{q,i},$$

where $c(CLASS_q)$ is the capacity of memories of the class, $w(CLASS_q)$ is the width of memories of the class, W is the width of the basic memories, $C_j$ is the capacity of the basic memories and $cl\_r_{q,i}$ is a minimum number of basic memories to which the class of memories can be mapped.

13. The process of claim 8, wherein similar user-defined memories are of a same type and have a same capacity.

14. The process of claim 8, wherein the order of classes of each queue is an ascending order of prices and the mapping techniques are first selected for classes with a smallest price for each queue.

15. A computer useable medium having a computer readable program embodied therein for addressing data to map a plurality of user-defined memories to pre-defined basic memories, the computer readable program comprising:
computer readable program code for causing the computer to input definitions of the user-defined memories and the basic memories;
computer readable program code for causing the computer to divide the user-defined memories into classes of similar user-defined memories, wherein similar user-defined memories in a given class have a same minimal possible number of basic memories of a particular type, width and capaciy into which each of the user-defined memories of the given class can be mapped; and
computer readable program code for causing the computer to iteratively calculate a maximal ratio of basic memories that have been mapped to basic memories that are available for mapping while selecting a mapping technique for members of a selected class of user-defined memories that minimizes the ratio.

16. The computer useable medium of claim 15, wherein the computer readable program further comprises:
computer readable program code for causing the computer to calculate an estimate of a number of different memory mappings necessary to map the user-defined memories to the basic memories,
computer readable program code for causing the computer to calculate whether the number of different memory mappings exceeds a threshold,
computer readable program code responsive to the computer determining that the threshold is exceeded for causing the computer to calculate a mapping price for each class, create a queue of classes arranged in an order based on respective mapping prices, and select the mapping technique for each class of each queue.

17. The computer useable medium of claim 16, wherein the computer readable program further comprises:

computer readable program code responsive to the computer determining that the threshold is not exceeded for causing the computer to select the mapping technique for each user-defined memory of each class.

18. The computer useable medium of claim 16, wherein computer readable program code that is responsive to the computer detennining that the threshold is exceeded causes the computer to calculate the mapping price based on a capacity and width of memories of the class and the capacity, width and a quantity of the basic memories.

19. The computer useable medium of claim 16, wherein computer readable program code that is responsive to the computer determining that the threshold is exceeded causes the computer to calculate the mapping price as $$\text{price}_{qj} = 1.0 - c(\text{CLASS}_q) * w(\text{CLASS}_q)/W/C_j/\text{cl\_r}_{q,i},$$

where $c(\text{CLASS}_q)$ is the capacity of memories of the class, $w(\text{CLASS}_q)$ is the width of memories of the class, W is the width of the basic memories, $C_j$ is the capacity of the basic memories and $\text{cl\_r}_{q,i}$ is a minimum number of basic memories to which the class of memories can be mapped.

20. The computer useable medium of claim 16, wherein computer readable program code that is responsive to the computer determining that the threshold is exceeded causes the computer to order the classes of each queue in an ascending order of prices and select the mapping techniques for classes with a smallest price for each queue first.

* * * * *

UNITED STATES PATENT AND TRADEMARK OFFICE
CERTIFICATE OF CORRECTION

| | | |
|---|---|---|
| PATENT NO. | : 7,219,321 B2 | Page 1 of 1 |
| APPLICATION NO. | : 10/830739 | |
| DATED | : May 15, 2007 | |
| INVENTOR(S) | : Andrey A. Nikitin et al. | |

It is certified that error appears in the above-identified patent and that said Letters Patent is hereby corrected as shown below:

Title Page,
Under (22) Filed: change "April 25, 2004" to --April 23, 2004--.

Signed and Sealed this

Sixth Day of November, 2007

JON W. DUDAS
*Director of the United States Patent and Trademark Office*